United States Patent [19]
Scott et al.

[11] 4,365,201
[45] Dec. 21, 1982

[54] FREQUENCY SYNTHESIZER

[75] Inventors: Richard I. H. Scott, Redhill; Michael J. Underhill, Horsham, both of England

[73] Assignee: U.S. Philips Corporation, New York, N.Y.

[21] Appl. No.: 196,406

[22] Filed: Oct. 14, 1980

[30] Foreign Application Priority Data

Oct. 30, 1979 [GB] United Kingdom ............... 7937487

[51] Int. Cl.$^3$ .............................................. H03L 7/18
[52] U.S. Cl. .................................. 328/14; 235/92 PE; 235/92 FQ; 340/347 M; 328/61
[58] Field of Search ............... 328/14, 61; 235/92 FQ, 235/92 PE; 340/347 M

[56] References Cited

U.S. PATENT DOCUMENTS 4,132,871 1/1979 Lake ........................................ 328/14
4,296,407 10/1981 Minakuchi ............................ 328/14
4,303,837 12/1981 Ansaldi et al. ....................... 328/14

Primary Examiner—John S. Heyman
Attorney, Agent, or Firm—Thomas A. Briody; William J. Streeter; Edward W. Goodman

[57] ABSTRACT

A frequency synthesizer of the type which selects pulses from a clock pulse generator (21) to provide a lower output frequency Fo, the synthesizer including an accumulator (22) of the type which, for each input pulse thereto, adds a preselected increment Y to the accumulated value in the accumulator and gives an overflow pulse each time an accumulated value C (where C is equal to or greater than Y) is reached or exceeded and leaves any excess (residue) in the accumulator. In accordance with the invention, adjustable delay means are coupled to the accumulator output such that each output pulse is delayed by an amount which depends on the residue in the accumulator thereby providing a spectrally pure output frequency.

4 Claims, 4 Drawing Figures

FREQUENCY SYNTHESIZER

BACKGROUND OF THE INVENTION

The invention relates to a frequency synthesizer of the type which selects pulses from a clock pulse generator, of higher frequency (Fc) than the required output frequency (Fo), in order to provide said frequency Fo; the synthesizer including an adjustable accumulator of the type which, for each input clock pulse thereto, adds a preselected adjustable increment Y to the accumulated value in the accumulator and gives an output pulse each time an accumulated value C (where C is equal to or greater than Y) is reached or exceeded and leaves any excess as a residue in the accumulator.

In such frequency dividers, the required output frequency Fo is obtained, in effect, by the blanking out by the accumulator of some of the pulses from the clock pulse generator in order to produce the lower frequency Fo. However, the output pulses from the accumulator are synchronized to the clock pulses and are unevenly distributed with respect to time. The output pulse train therefore displays a considerable amount of phase jitter.

One method of at least substantially reducing the phase jitter is known from United Kingdom Patent Specification No. 1,447,418, in which the accumulator is incorporated in a phase lock loop comprising a phase comparator and a voltage-controlled variable frequency oscillator (VFO). The residue in the accumulator is converted to an analogue signal which is synchronized with, and balanced against, the output of the phase comparator to compensate for any variation in the output of the latter due to phase jitter in one of the input signals to the phase comparator. The required output frequency Fo is taken from the output of the VFO.

SUMMARY OF THE INVENTION

It is the object of the present invention to provide a frequency synthesizer of the type described in the opening paragraph which provides a substantially spectrally pure output frequency direct from the output pulses of the accumulator.

According to the invention, there is provided a frequency synthesizer of the type which selects pulses from a clock pulse source, of higher pulse frequency (Fc) than the required output frequency (Fo), in order to provide said frequency Fo; the synthesizer including an adjustable accumulator of the type which, for each input clock pulse thereto, adds a preselected adjustable increment Y to the accumulated value in the accumulator and gives an output pulse each time an accumulated value C (where C is equal to or greater than Y) is reached or exceeded, any excess being left as a residue in the accumulator, characterized in that the synthesizer further includes delay means for delaying each output pulse n from the accumulator for a respective period which is a function of the residue Rn in the accumulator immediately after that output pulse.

The principal advantage of this frequency synthesizer is that the direct generation of the output waveform from the accumulator output eliminates the need for a phase lock loop and VFO.

The invention is based on the recognition and use of the fact that, with this type of adjustable accumulator, the value of the residue Rn in the accumulator immediately following each output pulse therefrom is indicative of where that pulse should have been on a time scale if the output pulses were free from jitter - i.e. on a precisely regular repetitive basis. Each residue is therefore used to generate a respective time delay such that a jitter-free pulse repetition rate, that is to say a spectrally pure output frequency, is produced.

In an embodiment of the invention, the delay means delays each output pulse by a respective period which is a function (1-Rn/Y)Fc. This has the advantage that it is possible to arrange the values such that the increment Y, expressed as a fraction of C, is equal to the frequency reduction factor applied to the clock pulse frequency Fc to give the required output frequency Fo.

In a further embodiment, the delay means delays each output pulse by $[(1-Rn/Y)Fc]+K'$ seconds where Fc is in Hertz and K' is a constant period which is small relative to the period of the frequency Fc. The small constant delay period K' is added to allow for the very small propagation and switching delays which occur in practice; thereby enabling the accumulator to settle down to its residual value before the residue is used to compute the delay concerned. While the addition of the period K' slightly restricts the upper value of Y, such a restriction is of relatively little importance in practice.

DESCRIPTION OF THE DRAWINGS

Embodiments of the invention will now be described, by way of example, with reference to the accompanying drawings, of which.

DESCRIPTION OF THE PREFERRED EMBODIMENTS

As stated above, the important property of the type of adjustable accumulator concerned is that the residue left in the accumulator each time an output pulse occurs is exactly the phase lag that the output pulse has suffered by being synchronized to the clock pulse rather than being in its proper position in time. The time delay period suffered by each pulse is given by the residue divided by the output pule frequency, namely Rn/YFc. Thus a correction delay of —Rn/YFc would be required to position each pulse correctly in time. However, since it is not possible to generate negative delays, at least one extra clock period delay has to be introduced to make all the delay corrections positive, i.e. each pulse is delayed by an amount $Rn'=(1'-Rn/Y)/Fc$.

In order to explain the basic principle of operation of frequency synthesizers according to the invention, it will be assumed that the clock pulse frequency Fc is 1MHz, the required synthesized frequency Fo is 700kHz, that the accumulator gives an output pulse each time its accumulated value reaches or exceeds unity, and that Y=0.7, i.e. each input clock pulse causes the value 0.7 to be added to any residue in the accumulator. With these values, the above expression resolves to $Rn'=(1-Rn/0.7)$ μs.

Figure 1:
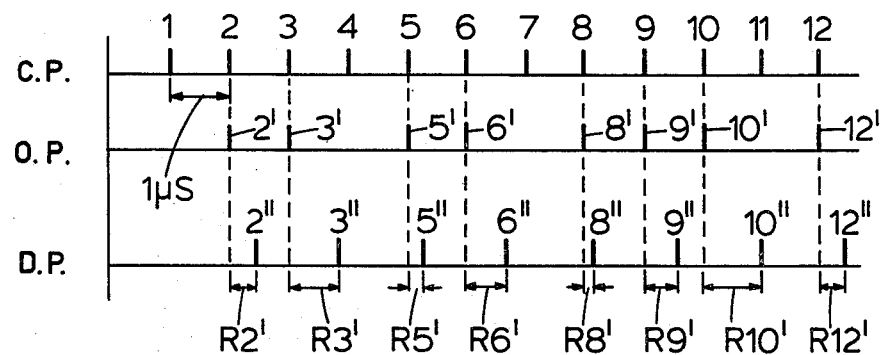
FIG. 1 shows a graphical illustration of the principle of operation of a frequency synthesizer according to the invention.

FIG. 1 shows, on a time basis, the input clock pulses n, the resulting output pulses n' from the accumulator, and these pulses (n'') delayed by their respective periods Rn' determined from the above expression. The following Table shows, for each of these pulses, the incremented value in the accumulator, the residue Rn in the accumulator, the resulting output pulses, and their respective delays Rn'.

TABLE

| CLOCK PULSES (1μS intervals) | INCREMENTED VALUE | RESIDUE Rn | OVER- FLOW PULSE | DELAY Rn'(μS) |
|---|---|---|---|---|
| 1 | 0.7 | R1-0.7 | — | |
| 2 | 1.4 | R2-0.4 | 2' | R2' 0.43 |
| 3 | 1.1 | R3-0.1 | 3' | R3' 0.86 |
| 4 | 0.8 | R4-0.8 | — | |
| 5 | 1.5 | R5-0.5 | 5' | R5' 0.29 |
| 6 | 1.2 | R6-0.2 | 6' | R6' 0.71 |
| 7 | 0.9 | R7-0.9 | — | |
| 8 | 1.6 | R8-0.6 | 8' | R8' 0.14 |
| 9 | 1.3 | R9-0.3 | 9' | R9' 0.57 |
| 10 | 1.0 | R10-0 | 10' | R10' 1.0 |
| 11 | 0.7 | R1-0.7 | — | |
| 12 | 1.4 | R2-0.4 | 12' | R2' 0.43 |

Referring now to the Table and FIG. 1, the first clock pulse enters the value 0.7 in the accumulator (Rn=0.7) but no output pulse is given because the value unity is not reached. The second clock pulse adds a further increment of 0.7; so the incremented value becomes 1.4, with the result that an output pulse 2' is given and the excess over unity (0.4) remains as a residue R2. The residue R2 is then converted to a respective delay period R2' (0.43 μs) in accordance with the above expression and the output pulse 2' is then delayed by this period to form a pulse 2''. The third clock pulse increments the residue of 0.4 in the accumulator by 0.7 and, therefore, the accumulator gives a further output pulse 3' and leaves a residue R3 of 0.1. This is converted to a delay R3' of 0.86 μs, at the end of which pulse 3'' is produced.

The fourth clock pulse increments the residue R3 by 0.7 to give residue R4 of 0.8. No output pulse is given because the value C=1 is not reached. The process then carries on in similar manner to the tenth clock pulse which causes an output pulse 10'' to be given after a delay R10' of 1.0 μs. FIG. 1 and the Table show that seven delayed output pulses are provided for the ten input clock pulses and that these delayed pulses are evenly spaced with respect to time - that is to say that there is no phase jitter.

The cycle then repeats itself, clock pulses 11 and 12 corresponding to clock pulses 1 and 2 and the resulting pulse 12'' appearing with the same interval as the previous pulses. Thus a train of pulses is produced having no phase jitter and having the required pulse repetition rate (frequency Fo) of 700 kHz (1MHz times 0.7).

A first embodiment of the invention will now be described with reference to FIG. 2, which shows a stable reference clock pulse generator 21 having a pulse repetition rate Fc. The output of generator 21 is fed to the input of a digital adjustable accumulator 22 of the type described above which is also fed, in parallel digital form, with the increment Y selected by an adjustable selector 23, for example a keypad. The increment Y, in digital form, is converted to analogue form by a digital to analogue converter (DAC) 24. The residue Rn in accumulator 22 is converted to analogue form in a further DAC 25. The output of DAC 25 is connected to the dividend input 26 of an analogue divider 27. The output of DAC 24 is connected to the divisor input 28 of divider 27 the output of which is connected to the subtrahend input 29 of an analogue subtractor 30. A preset constant analogue quantity 1+K is connected to the minuend input 31 of said analogue subtractor 30 and the output of subtractor 30 is connected to the delay control input 32 of an adjustable delay 33. The output of delay 33 is connected to a divide-by-two flip-flop 34 the output of which forms the synthesizer output. The overflow pulse output 35 of accumulator 22 is connected to trigger pulse input 36 of delay 33.

The operation of the synthesizer shown in FIG. 2 will now be described using the same assumptions as for FIG. 1 and the Table, namely that the clock pulse frequency Fc is 1 MHz, that C=1, and that Y=0.7. Thus the output pulses from, and the residue Rn in, the accumulator are as described above. The increment Y, in digital form, is fed to the accumulator 22 and the residue Rn is converted to analogue form by DAC 25. Each output pulse appearing at output 35 of the accumulator 22 triggers the adjustable delay 33. Divider 27 then operates on the Rn and the Y signals to provide an output Rn/Y which, after subtraction from the constant analogue signal 1+K in subtractor 30, then causes the adjustable delay 33 to provide an appropriately delayed output pulse. As explained above, the output pulse from delay 33 forms part of a pulse train which has no phase jitter and has a pulse repetition rate Y.Fc. These pulses can be used as the output of the frequency synthesizer but are preferably converted into a more convenient square waveform, by flip-flop 34, having a frequency of Y.Fc/2.

The portion K of the quantity 1+K, required in the practical embodiment, increases every delay period generated by delay 33 by a constant period K+, this period being small (e.g. <1.0 μS) relative to the period (1 μS) of frequency Fc. This allows time for the analogue voltages to settle after the appearance of an output pulse at output 33. Thus the delay Rn' imparted to each output pulse from the accumulator becomes $[(1-Rn/Y)/Fc]+K'$. This delay necessarily reduces the maximum permissible value for Y, for example Y<0.9, but this limitation is of little significance in practice.

Figure 2:
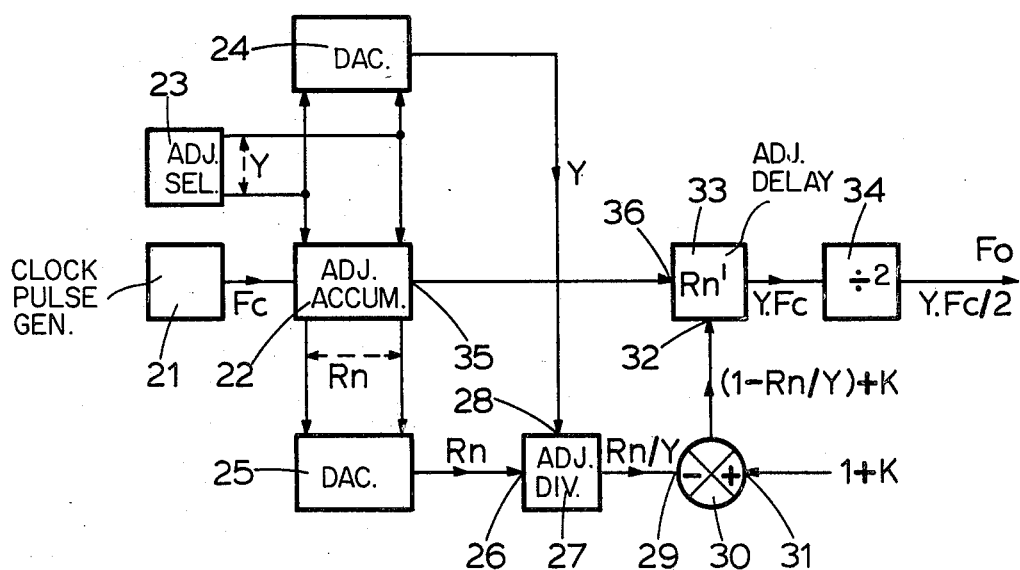
FIG. 2 shows, in circuit schematic form, a first embodiment of a frequency synthesizer according to the invention.
Figure 3:
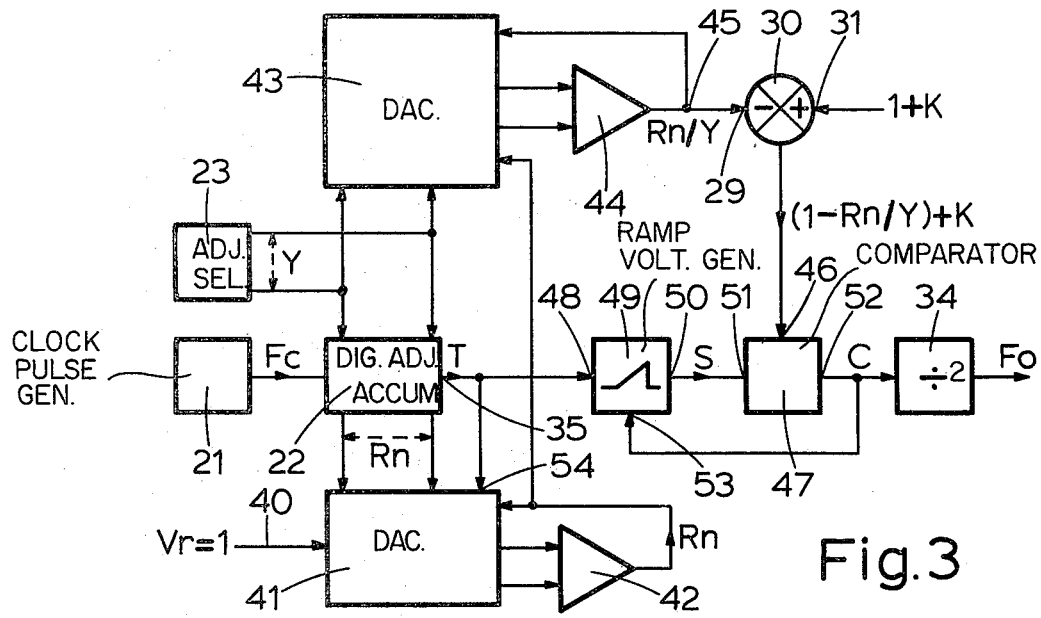
FIG. 3 shows, in circuit schematic form, a second embodiment of a frequency synthesizer according to the invention.
Figure 4:
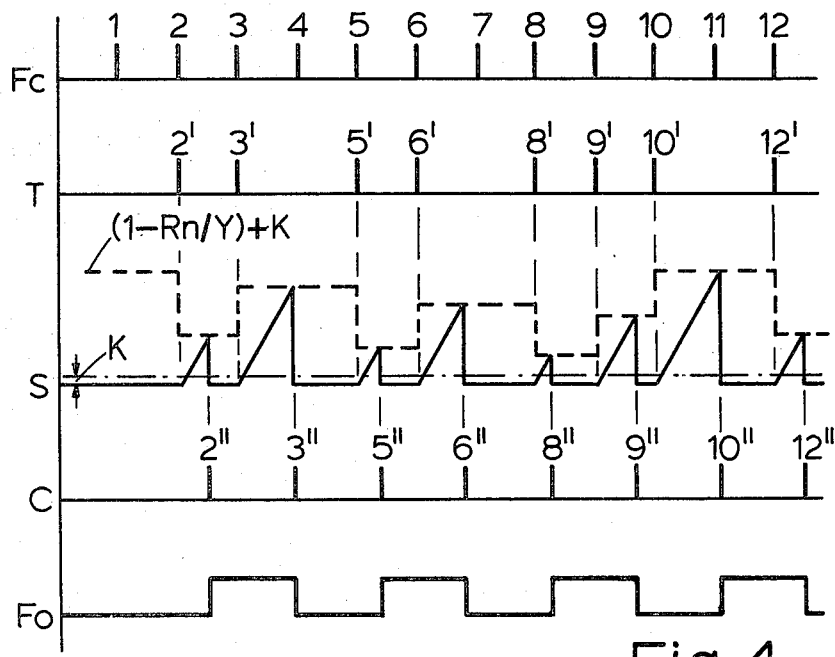
FIG. 4 is a timing chart which shows various waveforms in the embodiment shown in FIG. 3.

FIG. 3 shows a second embodiment of a frequency synthesizer according to the invention in which components corresponding to those shown in FIG. 2 are given the same references. FIG. 4 is a timing chart showing signal waveforms at various points in the circuit shown in FIG. 3.

In FIG. 3, the clock pulse generator 21, digital accumulator 22, and selector 23 operate in the same manner as described with reference to FIG. 2. The mathematical principle of operation is closely similar to that of the circuit shown in FIG. 2 but the function values involved are derived in a different fashion. A constant voltage signal 40 applied to a DAC 41 is the reference voltage $V_r$ for the analogue system, and is generally slightly less than the supply voltage. If we define this voltage as equal to 1 then the analogue voltages in the system are as shown in FIG. 3.

The (multiplying type) DAC 41 and an operational amplifier 42 provide an analogue signal at the output of amplifier 42 equivalent to Rn. This output signal is fed into the reference input of a DAC 43 which is in the feedback loop of an operational amplifier 44 and provides a division function. Hence the signal at point 45 is Rn/Y. This analogue signal is fed to a subtractor 30 and the output signal $(1-Rn/Y)+K$ is fed to one comparison input 46 of a comparator 47. The overflow pulses T appearing at output 35 of accumulator 22 are used as "ramp start" signals at input 48 of a fixed-slope ramp voltage generator 49. Ramp voltages appearing at output 50 of generator 49 are fed to another comparison input 51 of comparator 47, which comparator 47 provides an output signal at output 52 when the voltage levels at inputs 46 and 51 are equal. This output signal is fed to a 'reset ramp' input 53 of ramp generator 49 and also to the pulse input of a divide-by-two flip-flop 34.

The delay Rn' is, in this case, achieved by using the overflow pulses T at output 35 of accumulator 22 to cause ramp generator 49 to start generating a ramp voltage S which increases at a fixed ramp, see FIG. 4. When this voltage reaches the voltage $(1-Rn/Y)+K$ at input 46 of comparator 47, the latter provides an output signal which resets ramp generator 44. Due to the resetting of ramp generator 49, the signal at output 52 of comparator 47 comprises a short-duration pulse C. As will be explained with reference to FIG. 4, these pulses C constitute a pulse train having a jitter-free pulse repetition rate. Flip-flop 32 then provides a square wave output signal Fo having a frequency equal to half the pulse repetition rate of the pulses C.

As can be seen from FIG. 4, each pulse T initiates a ramp voltage S and the ramp is reset each time the ramp voltage reaches $(1-Rn/Y)+K$, whereupon an output pulse C is provided by the comparator. The slope of the ramp voltage is adjusted so that the required delay period Rn' is provided plus a small constant period K'. The value of K is exaggerated in FIG. 4 for the purposes of clarity. The small constant period K' (too small to be shown in FIG. 4) provides a "settling period" for each of the component devices and, since each output pulse C is delayed by the same constant period K', no jitter occurs in the output pulse train as a result thereof. The output frequency Fo is equal to $Y \cdot Fc/2$.

The DAC's 24, 25, 41 and 43 may be in the form of integrated circuit blocks, such as Analog Devices Type AD 7520, the Application Notes of which show the connections required to form the divider comprising DAC 43 and operational amplifier 44 and the multiplier comprising DAC 41 and amplifier 42.

The overflow pulse output 35 of accumulator 22 is connected to an input 54 of DAC 41 which serves as the strobe input of a group of D-type flip-flops (not shown) which cause the digital value of Rn to be strobed into DAC 41 only when an overflow pulse T appears. Thus the analogue value of Rn, and hence the value of $(1-Rn/Y)+K$, remains constant between overflow pulses. Thus, for example, the value of $(1-Rn/Y)+K$ does not change in FIG. 4 when clock pulses 4, 7 and 11 arrive.

In FIGS. 2 and 3, analogue divider 27, adjustable delay 33, flip-flop 34, analogue adder 30, analogue comparator 47, and voltage ramp generator 49, are all well known per se and are commercially available in integrated circuit form.

Accumulator 22 may be implemented in various ways. In one form it may comprise an adder one of whose addition inputs is fed with Y; the other addition input being connected to the Q outputs of D-type flip-flops whose D inputs are connected to the sum outputs of the adder. All D-types are clocked in parallel and on each clock pulse Y is added to the value stored in the D-type flip-flops. The 'carry out' signal from the adder is similarly clocked via a D-type flip-flop to provide the overflow pulses.

Although the described embodiments use parallel entry of the digital numbers concerned, serial entry of Y into the accumulator may alternatively be employed, of course, though this is not particularly favored due to the resulting increased processing time.

The divider 34 in FIGS. 2 and 3 can with advantage be a switchable ratio divider. For example, if made to divide by $2^n$, where n can be selected between 1 and as large a number as desired, the output frequency range of the synthesizer can in principle be extended downwards with continuous coverage, while only requiring that the preceding part of the synthesizer has a range of 2 to 1. Alternatively if divider 34 divides by $10^n$ the preceding part needs to have a 10 to 1 frequency range to provide continuous coverage.

We claim:

1. A frequency synthesizer of the type which selects pulses from a clock pulse source, of higher pulse frequency Fc than the required output frequency Fo, in order to provide said frequency Fo; the synthesizer including an adjustable accumulator which, for each input clock pulse thereto, adds a preselected adjustable increment Y to the accumulated value in the accumulator and gives an output pulse each time an accumulated value C, in which C is equal to or greater than Y, is reached or exceeded, any excess being left as a residue Rn in the accumulator, characterized in that the synthesizer further comprises adjustable delay means coupled to said adjustable accumulator output for delaying each output pulse n from the accumulator, said delay means having a control input coupled to said accumulator for accessing the residue Rn therein, whereby the amount each output pulse n from the accumulator is delayed is a function of the residue Rn in the accumulator immediately after that output pulse.

2. A frequency synthesizer as claimed in claim 1, characterized in that the delay means delays each accumulator output pulse by a respective period which is a function of $(1-Rn/Y)/Fc$.

3. A frequency synthesizer as claimed in claim 2, characterized in that each respective period is equal to $[(1-Rn/Y)/Fc]+K'$ seconds, where Fc is in Hertz and K' is a constant period which is small relative to the period of the frequency Fc.

4. A frequency synthesizer as claimed in any one preceding claim which further comprises an output frequency divider for switchable ratio.

* * * * *